(12) United States Patent
West et al.

(10) Patent No.: US 10,892,796 B1
(45) Date of Patent: Jan. 12, 2021

(54) UWB SPREAD SPECTRUM POWER SPATIAL COMBINING ANTENNA ARRAY

(71) Applicant: Rockwell Collins, Inc., Cedar Rapids, IA (US)

(72) Inventors: James B. West, Cedar Rapids, IA (US); Vadim Olen, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/825,235

(22) Filed: Mar. 20, 2020

(51) Int. Cl.
    *H04B 1/7163* (2011.01)
    *H03M 1/00* (2006.01)
    *H04B 1/405* (2015.01)
    *H04B 1/00* (2006.01)

(52) U.S. Cl.
    CPC ........ *H04B 1/71632* (2013.01); *H03M 1/001* (2013.01); *H04B 1/0057* (2013.01); *H04B 1/405* (2013.01)

(58) Field of Classification Search
    CPC ........ H04B 7/10; H04B 1/0057; H04B 1/405; H04B 7/0857; H04B 7/2041; H04B 1/71632; H03M 1/001
    See application file for complete search history.

(56) References Cited

U.S. PATENT DOCUMENTS

| | | | |
|---|---|---|---|
| 7,327,315 B2 | 2/2008 | Starkie et al. | |
| 7,889,784 B2 | 2/2011 | Krinsky et al. | |
| 7,907,098 B1 * | 3/2011 | West | H01Q 9/0442 343/792.5 |
| 8,744,373 B2 * | 6/2014 | Pourseyed | H01Q 3/24 455/101 |
| 9,226,269 B2 | 12/2015 | Magne | |
| 9,479,232 B1 | 10/2016 | Loui et al. | |
| 9,831,559 B2 | 11/2017 | West et al. | |
| 10,177,456 B2 * | 1/2019 | Chauloux | H01Q 21/062 |
| 10,305,195 B2 * | 5/2019 | Burr | H01Q 21/22 |
| 10,756,803 B2 * | 8/2020 | Leulescu | H04B 7/0691 |
| 2009/0102705 A1 | 4/2009 | Obermeyer | |
| 2018/0219587 A1 | 8/2018 | Huo et al. | |
| 2019/0252776 A1 * | 8/2019 | Hill | H01Q 21/062 |

FOREIGN PATENT DOCUMENTS

| | | |
|---|---|---|
| EP | 1568105 A1 | 8/2005 |
| EP | 1869734 A2 | 12/2007 |
| EP | 1940140 B1 | 8/2012 |
| IN | 5804CHE2014 A | 7/2016 |
| WO | 2014053077 A1 | 4/2014 |
| WO | 2019190500 A1 | 10/2019 |

\* cited by examiner

Primary Examiner — Khanh C Tran
(74) Attorney, Agent, or Firm — Suiter Swantz pc llo

(57) ABSTRACT

A log periodic antenna is used in a communication system that utilizes multiple channels to drive distinct frequency sub-bands within an ultra-wide band. The driving elements are active and specifically tuned to the operating sub-band of the channel. Each driving element may be synchronized via a single local oscillator. Driving element includes a modem and analog-to-digital converters to digitize a portion of the signal intended for the sub-band within the channel. Actively driven log periodic antennas can jam an ultra-wide band of the spectrum.

15 Claims, 7 Drawing Sheets

UWB SPREAD SPECTRUM POWER SPATIAL COMBINING ANTENNA ARRAY

BACKGROUND

Anti-jamming and low probability of intercept/detection systems and techniques are needed for near ground communications for up to forty km and greater than ten Mbps, Ultra-wide band systems, operating from about ten MHz to fifty GHz, can satisfy those requirements. Furthermore, log periodic are useful for ultra-wide band signals but are passively driven. Passive driving limits the potential power output of the system and especially power output in specific sub-bands.

Existing systems have difficulty providing the large dynamic range required; channel fading over wide bands and noise, especially in the low bands, are significant problems. Significant digital signal is processing is required.

Various embodiments of direct sequence spread spectrum radio have been attempted to combat the problem, but each has significant drawbacks. Direct sampling requires relatively complicated hardware, difficult single channel UWB antennas, and extremely high chip rate; also a single UWB channel is difficult to tune and vulnerable to jamming. Baseband or heterodyne mix have poor dynamic range and spectral flexibility, high modem complexity, require extremely wide band RF active circuits and difficult single channel UWB antennas, and extremely high chip rate. Multiplexed, fixed DSSS radio (heterodyne or super-heterodyne mix) have poor dynamic range and spectral flexibility and high modem complexity. Impulse radio is disadvantageous for low probability of intercept/detection. Photonic correlation for spreading and/or correlation does not support arbitrary modulation and is not desirable because of size, weight, power, and cost.

SUMMARY

In one aspect, embodiments of the inventive concepts disclosed herein are directed to a log periodic antenna and communication system that uses multiple channels to drive distinct frequency sub-bands within an ultra-wide band. The driving elements are active and specifically tuned to the operating sub-band of the channel, Each driving element may be synchronized via a single local oscillator.

In a further aspect, driving element includes a modem and analog-to-digital converters to digitize a portion of the signal intended for the sub-band within the channel.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
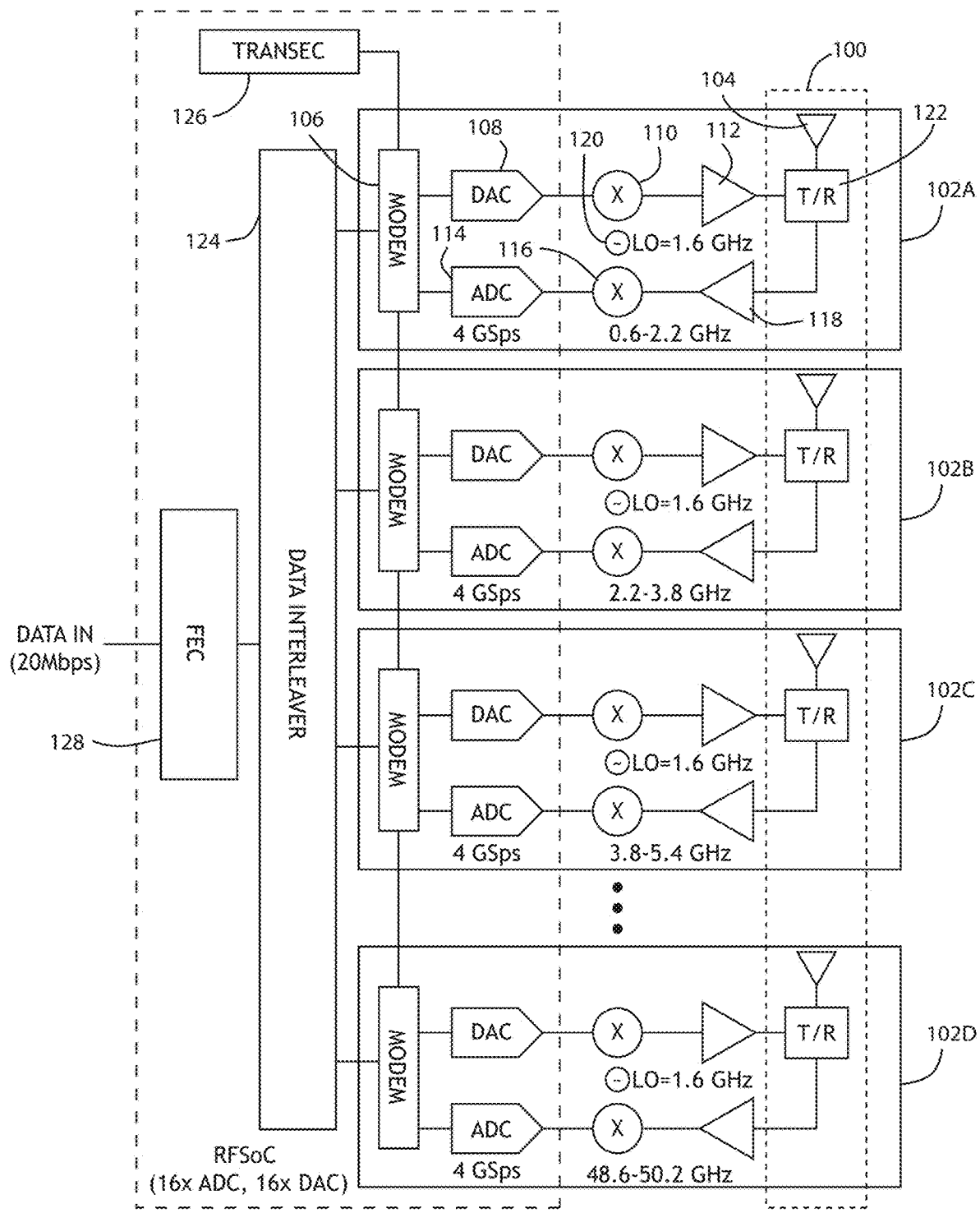
FIG. 1 shows a circuit diagram of an exemplary embodiment of a system for driving a log periodic antenna.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a log periodic antenna and communication system that uses multiple channels to drive distinct frequency sub-bands within an ultra-wide band. The driving elements are active and specifically tuned to the operating sub-band of the channel. Each driving element may be synchronized via a single coherent local oscillator, or several non-coherent local oscillators for broadband noise jamming.

Referring to FIG. 1, a circuit diagram of an exemplary embodiment of a system for driving a log periodic antenna 100 is shown. The system, configured to drive a log periodic antenna 100 having a plurality of radiating elements 104, defines a plurality of distinct channels 102A, 102B, 102C, 102D, Each channel 102A, 102B, 1020, 102D is configured to actively drive a set of radiating elements 104 in the log periodic antenna 100. Furthermore, each channel 102A, 102B, 102C, 102D and corresponding radiating elements 104 are configured for transmitting and receiving in distinct sub-bands.

In at least one embodiment, each channel 102A, 102B, 102C, 102D comprises a modem 106 configured to receive a signal and modulate (or demodulate) the signal according a carrier signal appropriate for the sub-band of the channel. Furthermore, each channel 102A, 102B, 102C, 102D may include a digital-to-analog converter 108 (and \ or analog-to-digital converter 114) to convert the modulated signal for transmission. The converted signal may be combined via a mixer for either upconversion or down conversion 110, 116 with a local oscillator 120 to change the frequency of the digital signal according to the sub-band corresponding to the channel 102A, 102B, 102C, 102D. In at least one embodiment, each channel 102A, 102B, 102C, 102D may include one or more amplifiers 112, 118 to amplify the signal before transmission (or after reception). A switch 122 may convert each channel 102A, 102B, 102C, 102D between a transmit more and a receive mode.

In at least one embodiment, each channel 102A, 102B, 102C, 102D is specifically tuned to a distinct sub-band with an Ultra-wide band. For example, each channel 102A, 102B, 102C, 102D may operate within a range of about 1.6 GHz; furthermore, each local oscillator 120 may operate at 1.6 GHz to facilitate such operation. In at least one embodiment, a first channel 102A may operate within a band of 0.6 GHz to 2.2 GHZ; a second channel 102B may operate within a band of 2.2 GHz to 3.8 GHz; a third channel 102C may operate within a band of 3.8 GHz to 5.4 GHz, etc., up to a final channel 102D which may operate within a band of 48.6 GHz to 50.2 GHz. In such embodiment, the system may comprise thirty-two or more independent channels 102A, 102B, 102C, 102D. Each element within the channel 102A, 102B, 102C, 102D may be specifically tuned to the corresponding sub-band. In at least one embodiment, each 1.6 GHz channel 102A, 102B, 102C, 102D may be turned on or off independently so that power consumption, spectrum allocation, data spreading, and data bandwidth can be adjusted dynamically.

In at least one embodiment, a data interleaver 124 parses an incoming data packet for distribution to the individual modems 106; furthermore, each modem 106 may be connected to a security element 126 configured to facilitate data inscription of the portion of the data packet received by each modem 106. In at least one embodiment, the system includes a forward error correction element 128 to process data packets before partitioning.

In at least one embodiment, the data interleaver 124 or signal source may deliver a substantially randomized signal (noise) to the modems 106 in one or more of the channels 102A, 102B, 102C, 102D, and operate the one or more channels 102A, 102B, 102C, 102D to jam the corresponding sub-band. In at least one embodiment, all f the sub-channels 102A, 102B, 102C, 102D may be jammed by driving the entire log periodic antenna 100 at full power. Alternatively, certain sub-bands may be left open for friendly use, or potentially to direct unfriendly use into a constrained bandwidth. It may be appreciated that every embodiment described herein may be applicable to active jamming applications as well as anti-jamming applications.

Figure 2:
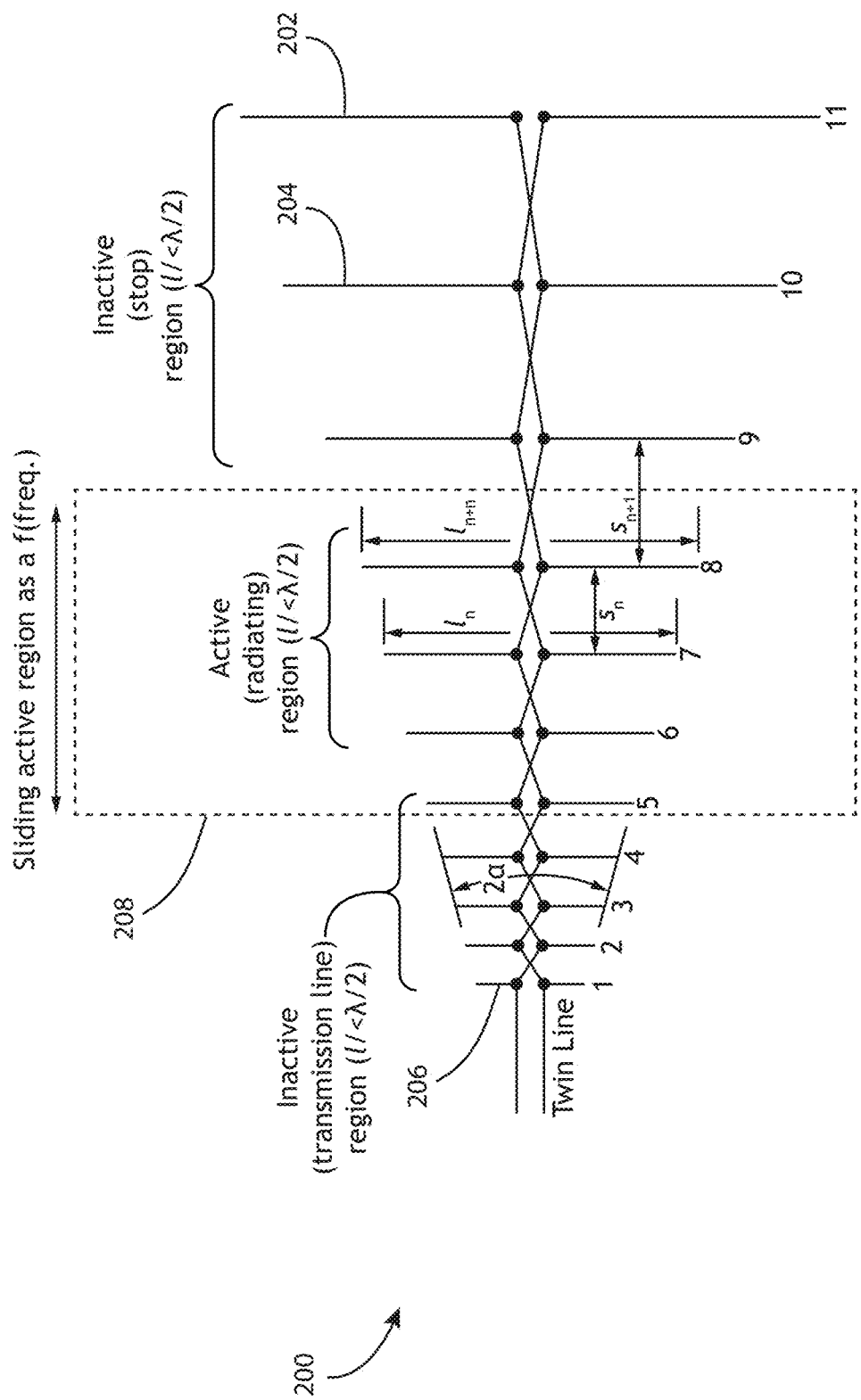
FIG. 2 shows a block diagram of a log periodic antenna useful for implementing exemplary embodiments.

Referring to FIG. 2, a block diagram of a log periodic antenna 200 useful for implementing exemplary embodiments is shown. In at least one embodiment, log periodic antennas 200 comprise a plurality of radiating elements 202, 204, 206, each configured to transmit and or receive signals in a particular frequency range. Traditionally, the log periodic antenna 200 has an active region 208 defined by the current frequency of the signal being transmitted and or received. In at least one embodiment, each radiating element 202, 204, 206 is associated with one of a plurality of driving elements, each driving element configured for operation in a distinct sub-band of the entire operating range of the log periodic antenna 200 corresponding to an active region 208. In such embodiments, the entire log periodic antenna 200 may be actively driven.

Existing passive feed is realized as a crisscrossed feed to add 180° phase shift between radiating elements 202, 204, 206. Adjacent radiating elements 202, 204, 206 are out of phase to minimize parasitic interaction. Larger and longer radiating elements 202, 204, 206 radiating with an inter-element phase shift may produce and end-fire radiation pattern.

Figure 3:
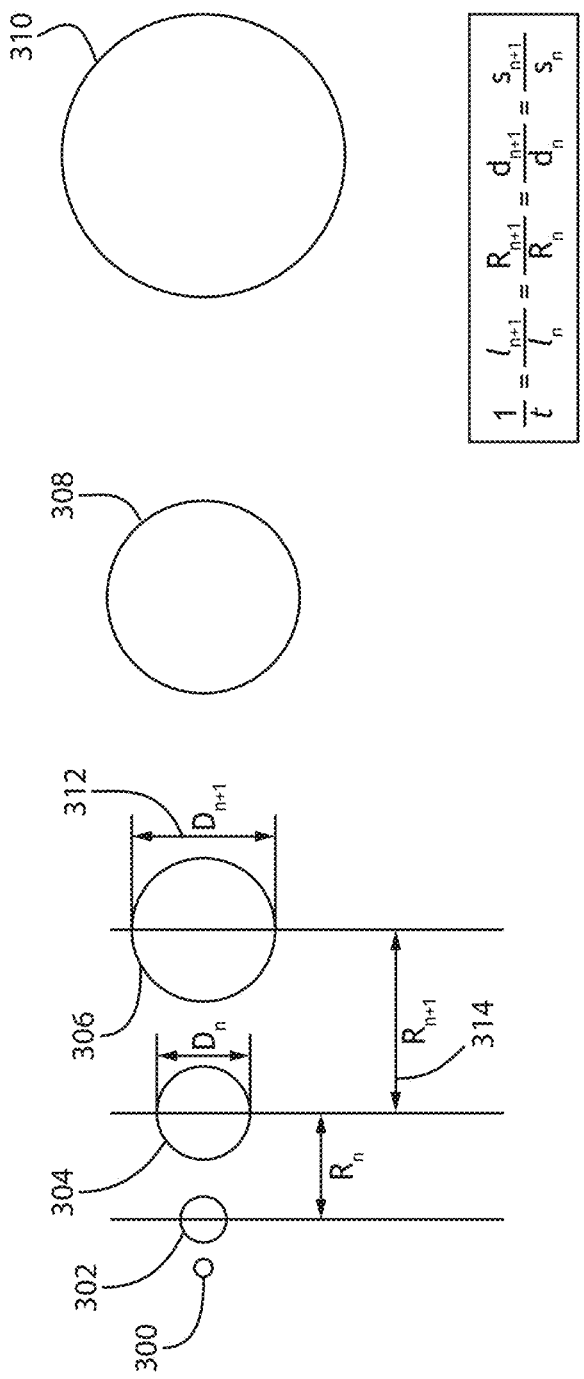
FIG. 3 shows a block diagram of log periodic radiating elements useful for implementing exemplary embodiments.

Referring to FIG. 3, a block diagram of log periodic radiating elements 300, 302, 304, 306, 308, 310 useful for implementing exemplary embodiments is shown. The radiating elements 300, 302, 304, 306, 308, 310 each have a diameter 312 defined by the intended frequency band in which the specific radiating element 300, 302, 304, 306, 308, 310 is configured to operate. Furthermore, the radiating elements 300, 302, 304, 306, 308, 310 are separated by an inter-element separation 314 ($R_n$) defined by the operating bands of the antenna and a scaling factor $\tau$ such that:

$$\frac{1}{\tau} = \frac{l_{n+1}}{l_n} = \frac{R_{n+1}}{R_n} = \frac{d_{n+1}}{d_n} = \frac{s_{n+1}}{s_n}$$

Log periodic arrays may be Implemented with many types of radiating elements 300, 302, 304, 306, 308, 310, including dipoles, patches, slots, helical, spirals, horns, dipoles above ground, dielectric resonator antennas (DRA), etc, Both normal and end-fire radiation is possible. The elements can be of any polarization state. Additionally, sub-band polarization diversity can be implemented for sub-channel isolation as needed; for example, one of two adjacent sub-bands (channels) may be used for information transmission, while the other sub-band (channel) may be used for noise jamming.

Figure 4:
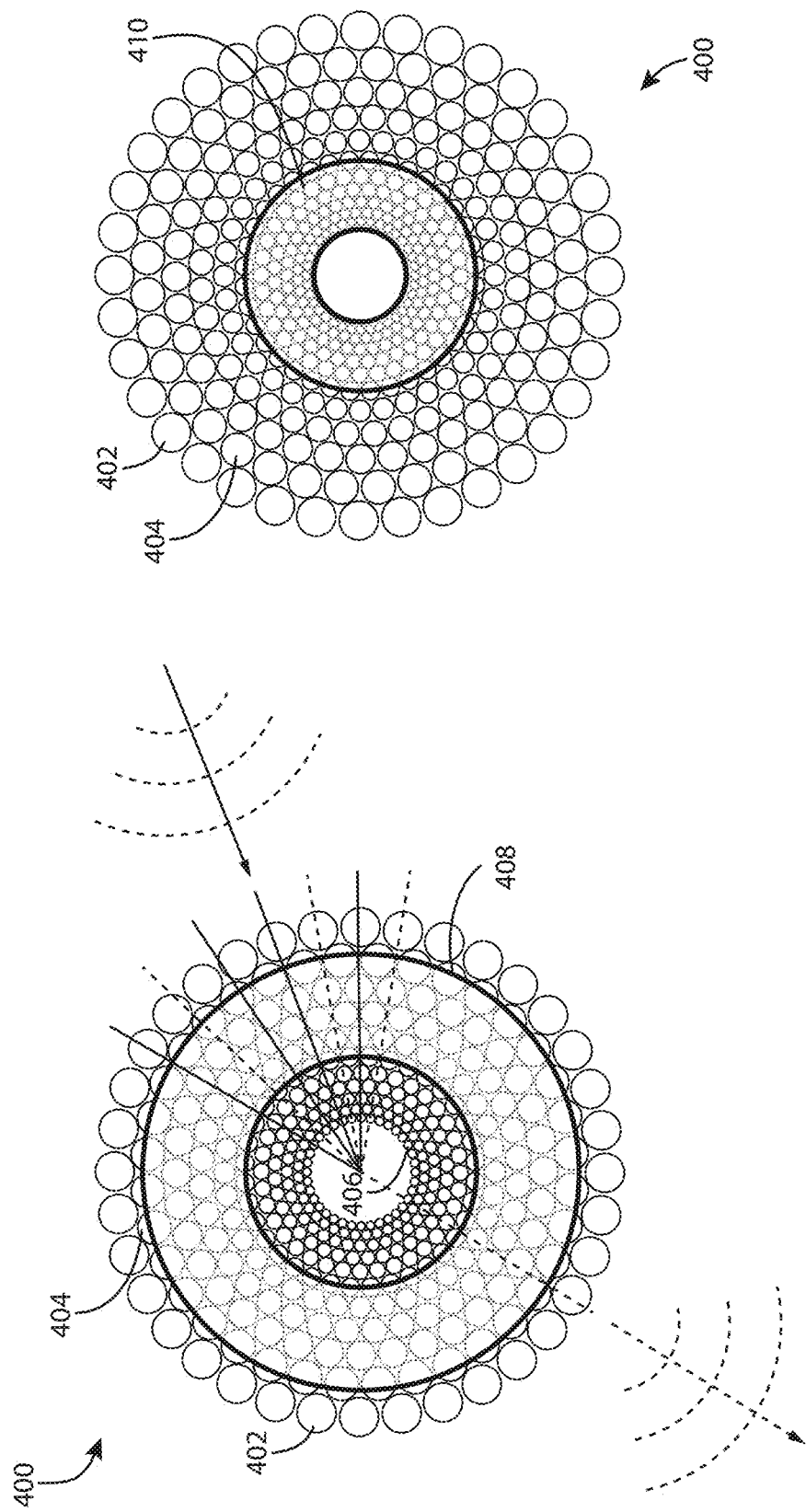
FIG. 4 shows representation of a planar log periodic antenna useful form implementing exemplary embodiments.

Referring to FIG. 4, representation of a planar log periodic antenna 400 useful form implementing exemplary embodiments is shown. The planar log periodic antenna 400 comprises a plurality of planar radiating elements 402, 404, 406 disposed substantially in a substantially 2D plane. The diameter of each radiating element 402, 404, 406 is defined by the operating frequency band of the radiating element 402, 404, 406 (and corresponding set of similar radiating elements 402, 404, 406).

Existing planar log periodic antennas 400 have an active region 408, 410 defined by the frequency of the signal being transmitted and/or received, and is characterized by a bandwidth ratio of the corresponding outer diameter and inner diameter. In at least one embodiment, each radiating element 402, 404, 406 is associated with one of a plurality of driving elements, each driving element configured for operation in a distinct sub-band of the entire operating range of the log periodic antenna 400 corresponding to an active region 408, 410. In such embodiments, the entire log periodic antenna 400 may be actively driven.

Planar log periodic antennas 400 may be implemented as microstrip patch arrays. The ultra-wide band signal comprises a directional beam perpendicular to the antenna 400 surface. Log periodic dimensional growth enables ultra-wide band operation.

Figure 5:
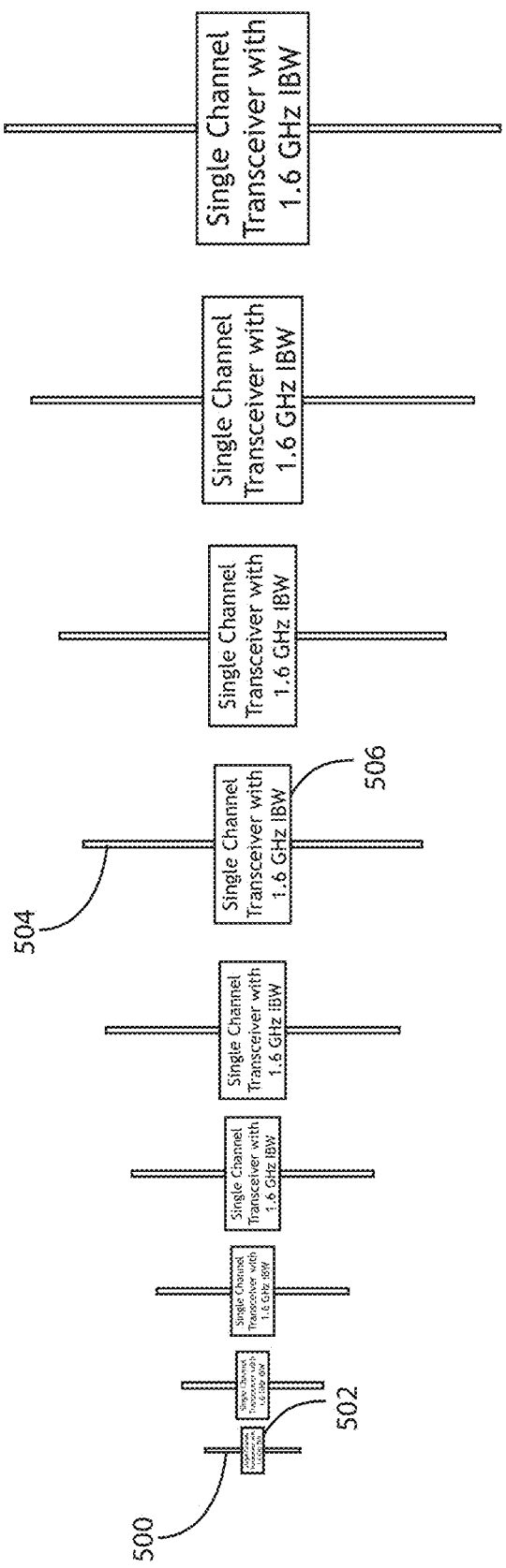
FIG. 5 shows a block representation of log periodic radiating elements according to an exemplary embodiment.

Referring to FIG. 5, a block representation of log periodic radiating elements 500, 504 according to an exemplary embodiment is shown, Each radiating element 500, 504 is associated with a transceiver 502, 506 configured to operate in a sub-band, and in particular a sub-band having 1.6 GHz bandwidth. Passive feed of the various radiating elements 500, 504 is replaced with an active, coherent 1.6 GHz electronic channel feeding each radiating element 500, 504. Amplitude phase shift (time delay) of the individual active RF channels replicate frequency impedance and current excitation dependence normally associated with a log periodic antenna passive feed.

Figure 6:
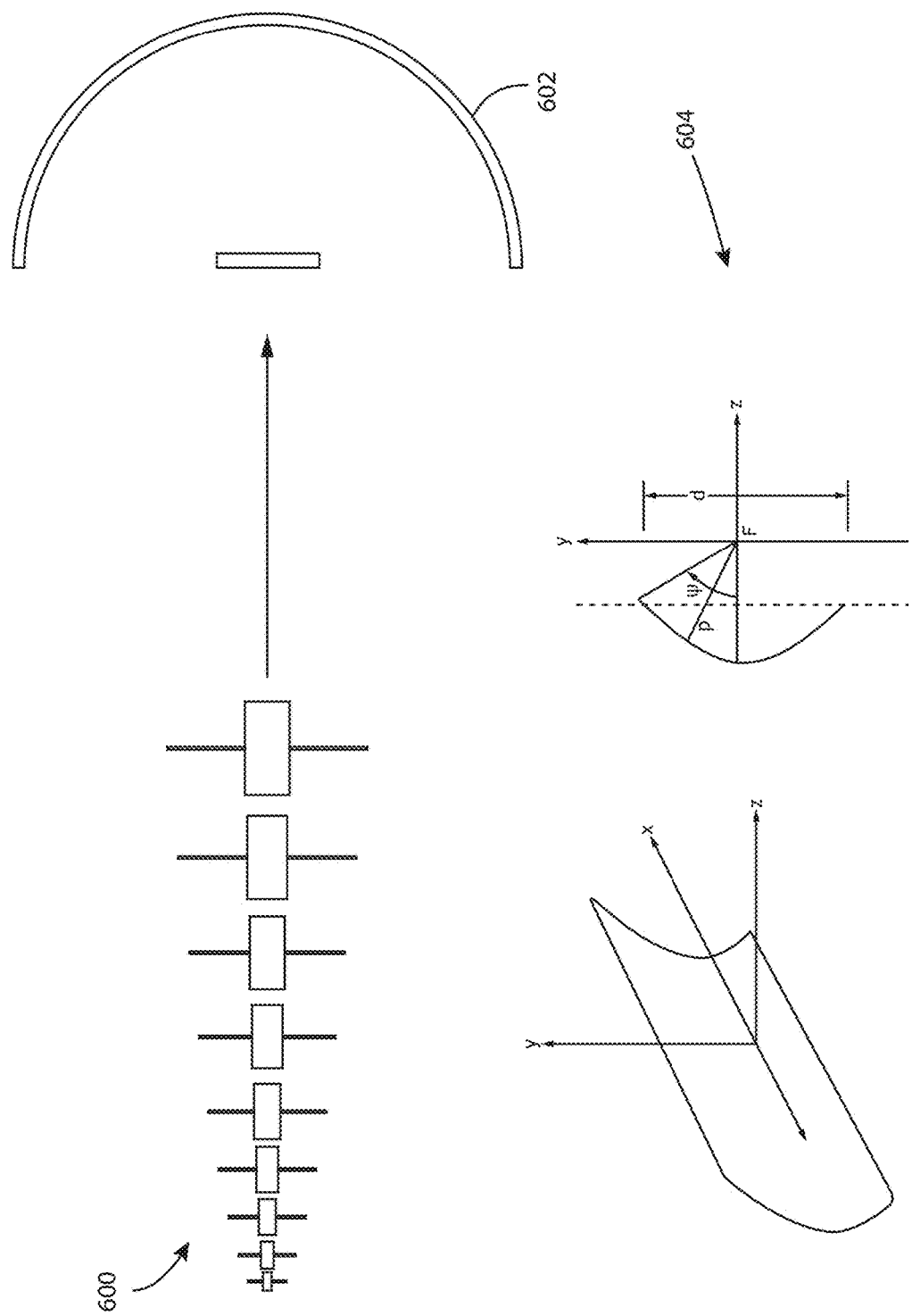
FIG. 6 shows a block representation of log periodic radiating elements according to an exemplary embodiment.

Referring to FIG. 6, a block representation of log periodic radiating elements according to an exemplary embodiment is shown. In at least one embodiment, a log periodic antenna 600 with active sub-band driving may be configured to drive a cylindrical reflector 602 for increased directivity. Linear log periodic antennas are placed along the cylindrical reflector's 602 focal line to maintain proper f d ratio as shown in the chart 604.

Figure 7:
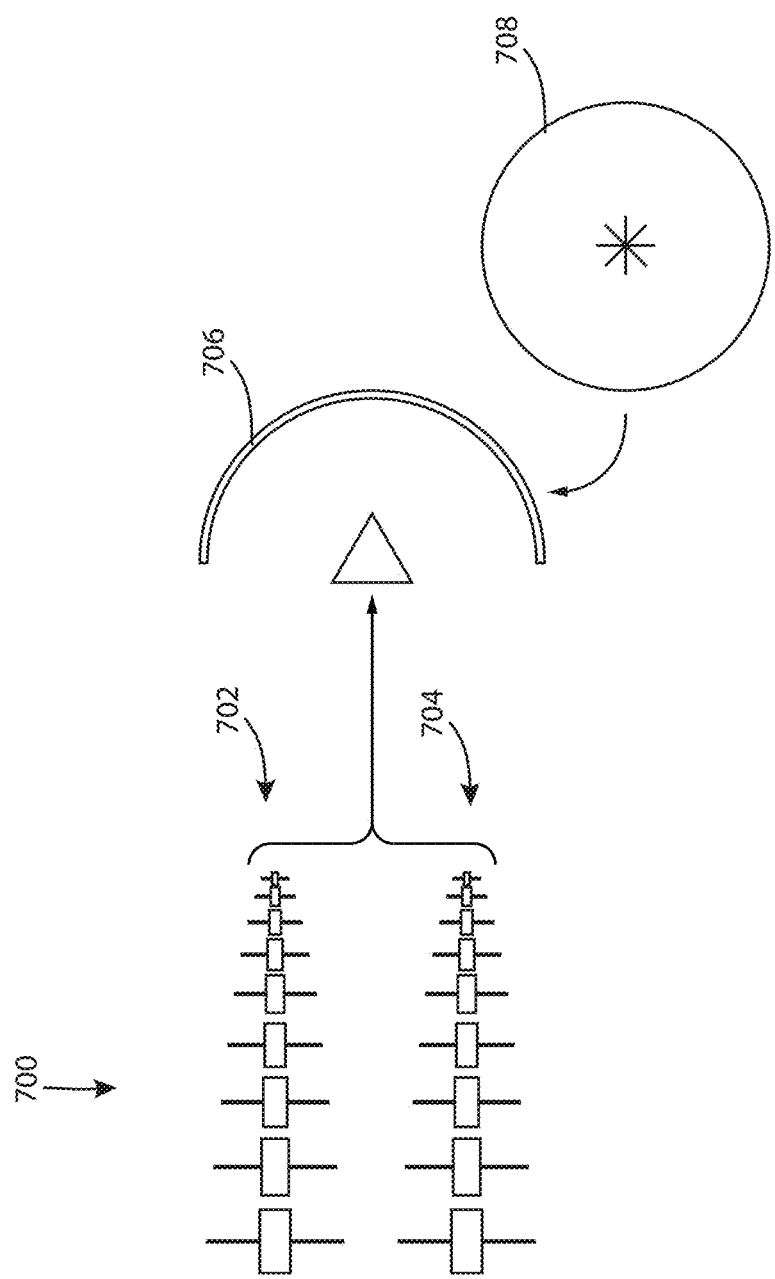
FIG. 7 shows a block representation of log periodic radiating elements according to an exemplary embodiment.

Referring to FIG. 7, a block representation of log periodic radiating elements according to an exemplary embodiment is shown. In at least one embodiment, an antenna 700 comprises a 2D linear periodic array of linear periodic dipole antennas 702, 704. The antenna 700 may be configured to emulate a 2D shaped reflector 706, 708. Extensions of the planar array may be singly or doubly curved conformal structures; for example cylindrical or spherical array configurations.

Embodiments of the present disclosure enable ultra-wide band performance through coherent sub-banding of reasonable RF channel bandwidths. Each sub-band can be optimized in terms of RF hardware implementation. Sub-band level digitization and interleaving reduces the bottleneck associated with moderate sampling speeds. Forward error correction enhances sub-band coherent aggregation. Radiating element choices may be optimized against the individual sub-band frequencies of the log periodic antenna array.

Embodiments are applicable to space borne, airborne, maritime, mobile terrestrial, and fixed point-to-point scenarios systems. Embodiments may be electronically scanned. Signals may be digitally upconverted or downconverted via each of the sub-band channels. Coherent combing/splitting is performed in the digital domain to realize the ultra-wide band spread spectrum waveform. Each channel is independently designed with fixed-frequency optimal components. Cascade can be by direct synthesis, direct conversion, or double conversion, as is appropriate for each band. Small, efficient, fixed-frequency integer multiple local oscillators may be used.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. An ultra-wide band spread spectrum communication system comprising:
   a log periodic antenna comprising a plurality of radiating elements;
   a plurality of active driving elements, each uniquely associated with one or more of the plurality of radiating elements, each active driving element comprising:
   a modem;
   a mixer;
   a low-noise amplifier; and
   a local oscillator,
   wherein:
   each active driving element defines a separate channel operating in a distinct sub-band; and
   each active driving element is configured to broadcast at least a portion of a data packet within the corresponding distinct sub-band.

2. The ultra-wide band spread spectrum communication system of claim 1, wherein at least a first active driving element is configured receive data and at least a second active driving element is configured for noise jamming.

3. The ultra-wide band spread spectrum communication system of claim 2, wherein the second active driving element and a third active driving element are configured for coherent noise jamming.

4. The ultra-wide band spread spectrum communication system of claim 2, wherein the second active driving element and a third active driving element are configured for incoherent ultra-wide band noise jamming.

5. The ultra-wide band spread spectrum communication system of claim 1, further comprising a data interleaver connected to each modem, the data interleaver configured to divide the data packet among the plurality of active driving elements.

6. The ultra-wide band spread spectrum communication system of claim 5, wherein each active driving element further comprises an analog-to-digital converter, and the data packet is digitized within the active driving element.

7. The ultra-wide band spread spectrum communication system of claim 5, wherein each active driving element is configured to digitally upconvert and digitally down convert signals within the corresponding distinct sub-band.

8. An ultra-wide band antenna comprising:
   a log periodic antenna comprising a plurality of radiating elements;

a plurality of active driving elements, each uniquely associated with one or more of the plurality of radiating elements, each active driving element comprising:
a modem;
a power amplifier; and
a local oscillator,
wherein:
   each active driving element defines a separate channel operating in a distinct sub-band; and
   at least one active driving element is configured to broadcast noise in the corresponding distinct sub-band.

9. The ultra-wide band antenna of claim 8, wherein all of the active driving elements are configured to broadcast noise in the corresponding distinct sub-band.

10. The ultra-wide band antenna of claim 9, wherein the noise in each sub-band is coherent.

11. The ultra-wide band antenna of claim 9, wherein the noise in each sub-band is generated randomly.

12. The ultra-wide band antenna of claim 8, wherein each local oscillator operates at the same frequency.

13. The ultra-wide band antenna of claim 8, wherein the log periodic antenna comprises a 2D planar array.

14. The ultra-wide band antenna of claim 8, wherein the log periodic antenna comprises a microstrip linear log periodic array.

15. The ultra-wide band antenna of claim 8, further comprising a data interleaver connected to each modem, the data interleaver configured to divide the data packet among the plurality of active driving elements.

* * * * *